(12) United States Patent
Lim et al.

(10) Patent No.: US 10,700,140 B2
(45) Date of Patent: Jun. 30, 2020

(54) ELECTROLUMINESCENT DISPLAY DEVICE

(71) Applicant: LG Display Co., Ltd., Seoul (KR)

(72) Inventors: Hyeong-Jun Lim, Paju-si (KR);
Han-Sun Park, Paju-si (KR);
Hyung-Seok Bang, Paju-si (KR);
Ji-Yeon Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/210,375

(22) Filed: Dec. 5, 2018

(65) Prior Publication Data
US 2019/0172874 A1   Jun. 6, 2019

(30) Foreign Application Priority Data
Dec. 5, 2017   (KR) .................. 10-2017-0166006

(51) Int. Cl.
*H01L 27/32* (2006.01)
*H01L 51/52* (2006.01)
*H01L 51/50* (2006.01)

(52) U.S. Cl.
CPC ........ *H01L 27/322* (2013.01); *H01L 27/3211* (2013.01); *H01L 51/5012* (2013.01);
(Continued)

(58) Field of Classification Search
CPC .................... H01L 27/322; H01L 27/3211
(Continued)

(56) References Cited

U.S. PATENT DOCUMENTS

2006/0202613 A1   9/2006   Kawaguchi et al.
2009/0125321 A1   5/2009   Charlebois et al.
(Continued)

FOREIGN PATENT DOCUMENTS

CN   101034715 A   9/2007
EP   2 731 156 A2   5/2014
(Continued)

OTHER PUBLICATIONS

Extended European Search Report dated Apr. 17, 2019, issued in corresponding European Application No. 18210235.0.
(Continued)

*Primary Examiner* — Christopher M Raabe
(74) *Attorney, Agent, or Firm* — Morgan, Lewis & Bockius LLP

(57) ABSTRACT

An electroluminescent display device is disclosed. The disclosed electroluminescent display device includes a substrate including a plurality of pixel regions; a plurality of light emitting diodes spaced apart from each other on the substrate and each corresponding to the plurality of pixel regions, respectively; a plurality of encapsulation films respectively covering each of the light emitting diodes of the plurality of light emitting diodes, wherein the plurality of encapsulation films has a first refractive index; a first partition wall disposed between each of the encapsulation films of the plurality of encapsulation films, wherein the first partition wall corresponds to a boundary between the plurality of pixel regions and has a second refractive index lower than the first refractive index; and a color filter layer disposed on the plurality of encapsulation films and the first partition wall.

15 Claims, 6 Drawing Sheets

(52) U.S. Cl.
CPC ...... *H01L 51/5206* (2013.01); *H01L 51/5221* (2013.01); *H01L 51/5256* (2013.01); *H01L 51/5271* (2013.01); *H01L 51/5275* (2013.01); *H01L 27/3244* (2013.01); *H01L 51/5268* (2013.01)

(58) Field of Classification Search
USPC ......................................................... 313/498
See application file for complete search history.

(56) References Cited

U.S. PATENT DOCUMENTS

| | | | |
|---|---|---|---|
| 2014/0124749 A1* | 5/2014 | Kim | H01L 51/5284 257/40 |
| 2014/0339509 A1* | 11/2014 | Choi | H01L 51/5275 257/40 |
| 2015/0008399 A1* | 1/2015 | Choi | H01L 51/5253 257/40 |
| 2015/0188092 A1 | 7/2015 | Park et al. | |
| 2015/0277017 A1* | 10/2015 | Aoyagi | H01L 51/5271 362/608 |
| 2016/0043145 A1* | 2/2016 | Choi | H01L 27/322 257/40 |
| 2016/0087245 A1 | 3/2016 | Park et al. | |
| 2018/0138458 A1* | 5/2018 | Tokuda | H01L 27/3246 |
| 2018/0159080 A1 | 6/2018 | Shimoyama et al. | |
| 2018/0190740 A1* | 7/2018 | Bang | H01L 51/504 |
| 2018/0219170 A1 | 8/2018 | Kato et al. | |
| 2019/0165061 A1* | 5/2019 | Jung | H01L 27/3246 |
| 2019/0165318 A1* | 5/2019 | Choi | H01L 51/5268 |
| 2019/0219875 A1* | 7/2019 | Jung | G02F 1/133514 |

FOREIGN PATENT DOCUMENTS

| | | |
|---|---|---|
| JP | 2013-258021 A | 12/2013 |
| JP | 2014-096346 A | 5/2014 |
| JP | 2015-162588 A | 9/2015 |
| JP | 2017-037741 A | 2/2017 |
| JP | 2017-073260 A | 4/2017 |
| JP | 2018-092873 A | 6/2018 |
| KR | 10-2015-0043136 A | 4/2015 |
| KR | 10-2015-0090474 A | 8/2015 |
| TW | 201731093 A | 9/2017 |

OTHER PUBLICATIONS

Search Report issued in related Taiwanese Patent Application No. 107142310 dated Dec. 10, 2019.

* cited by examiner

ELECTROLUMINESCENT DISPLAY DEVICE

This application claims priority from and the benefit of Korean Patent Application No. 10-2017-0166006, filed on Dec. 5, 2017, which is incorporated herein by reference in its entirety for all purposes as if fully set forth herein.

BACKGROUND

Technical Field

The present disclosure relates to an electroluminescent display device, and more particularly, to an electroluminescent display device in which a partition wall having a low refractive index is disposed so that light extraction efficiency may be improved and color mixture may be substantially prevented.

Discussion of the Related Art

In recent years, flat panel displays having excellent characteristics, such as being thin, lightweight, and having low power consumption have been widely developed and applied to various fields. Among the flat panel displays, an electroluminescent display device is a device in which electrical charge carriers are injected into a light-emitting layer formed between a cathode and an anode. The cathode is an electron-injecting electrode. The anode is a hole-injecting electrode. Excitons are then formed and finally, radiative recombination of the excitons occurs, thereby emitting light.

The electroluminescent display device is formed using a flexible substrate, such as plastic because it is self-luminous and has excellent contrast ratios. The electroluminescent display device has a response time of several microseconds, which is advantageous for displaying moving images. The electroluminescent display device also has wide viewing angles and is stable under low temperatures. Because the electroluminescent display device is driven by a low voltage of direct current (DC) of about 5 V to 15 V, it is easy to design and manufacture driving circuits. Recently, as the size of substrates has been increased and display devices have evolved to have a high resolution, pixel pitch has been decreased and color mixture has become a problem.

SUMMARY

Accordingly, example embodiments of the present disclosure are directed to an electroluminescent display device that substantially obviates one or more of the problems due to limitations and disadvantages of the related art. An aspect of the present disclosure is to provide an electroluminescent display device with high resolution in which a first partition wall and a second partition wall having a relatively low refractive index are disposed so that light extraction efficiency may be improved and/or color mixture may be prevented.

To achieve these and other aspects of the inventive concepts, and in accordance with the purpose of the present invention, as embodied and broadly described, an electroluminescent display device includes: a substrate including a plurality of pixel regions; a plurality of light emitting diodes spaced apart from each other on the substrate and each corresponding to the plurality of pixel regions, respectively; a plurality of encapsulation films respectively covering each of the light emitting diodes of the plurality of light emitting diodes, wherein the plurality of encapsulation films has a first refractive index; a first partition wall disposed between each of the encapsulation films of the plurality of encapsulation films, wherein the first partition wall corresponds to a boundary between the plurality of pixel regions and has a second refractive index lower than the first refractive index; and a color filter layer disposed on the plurality of encapsulation films and the first partition wall, wherein the color filter layer includes a plurality of color filter patterns having a third refractive index and the color filter layer further includes a second partition wall disposed between each of the plurality of color filter patterns, and wherein the second partition wall has a fourth refractive index lower than the third refractive index.

It is to be understood that both the foregoing general description and the following detailed description are by example and explanatory, and are intended to provide further explanation of the inventive concepts as claimed.

BRIEF DESCRIPTION OF THE DRAWINGS

The accompanying drawings, which are included to provide a further understanding of the present disclosure, and which are incorporated in and constitute a part of this specification, illustrate example embodiments of the present disclosure and together with the description serve to explain various principles of the present disclosure. In the drawings.

DETAILED DESCRIPTION

Reference will now be made in detail to example embodiments of the present disclosure, examples of which may be illustrated in the accompanying drawings.

First Example Embodiment

Figure 1:
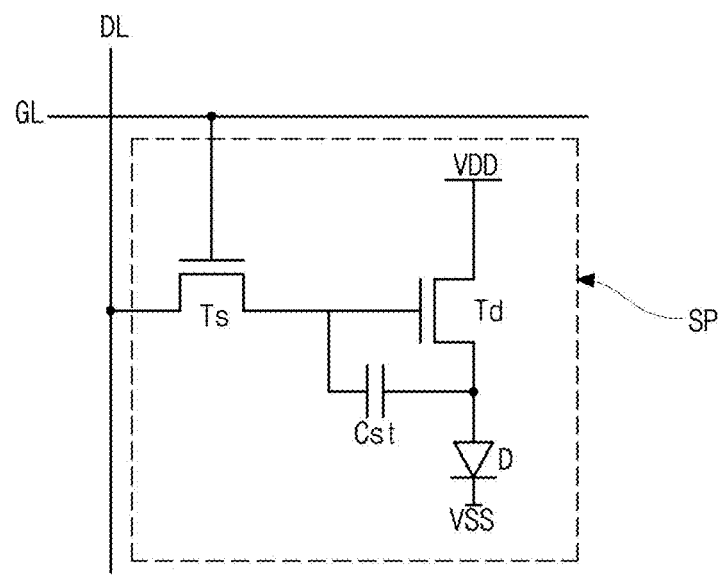
FIG. 1 is a circuit diagram illustrating a single pixel region of an electroluminescent display device according to an example embodiment of the present disclosure.

FIG. 1 is a circuit diagram illustrating a single pixel region of an electroluminescent display device according to an example embodiment of the present disclosure.

As illustrated in FIG. 1, the electroluminescent display device according to an example embodiment of the present disclosure may include a gate line GL, a data line DL, a switching thin film transistor Ts, a driving thin film transistor Td, a storage capacitor Cst and a light-emitting diode D. The gate line GL and the data line DL may cross each other to define a pixel region SP. The switching thin film transistor Ts, the driving thin film transistor Td, the storage capacitor Cst and the light-emitting diode D may be formed in the pixel region SP.

A gate electrode of the switching thin film transistor Ts may be connected to the gate line GL and a source electrode of the switching thin film transistor Ts may be connected to the data line DL. A gate electrode of the driving thin film transistor Td may be connected to a drain electrode of the switching thin film transistor Ts and a source electrode of the driving thin film transistor Td may be connected to a high voltage supply VDD. An anode of the light-emitting diode D may be connected to a drain electrode of the driving thin film transistor Td and a cathode of the light-emitting diode D may be connected to a low voltage supply VSS. The storage capacitor Cst may be connected to the gate electrode and the drain electrode of the driving thin film transistor Td.

The electroluminescent display device may be driven to display an image. For example, when the switching thin film transistor Ts is turned on by a gate signal applied through the gate line GL, a data signal from the data line DL may be applied both to the gate electrode of the driving thin film transistor Td and/or to an electrode of the storage capacitor Cst through the switching thin film transistor Ts.

When the driving thin film transistor Td is turned on by the data signal, an electric current flowing through the light-emitting diode D may be controlled, thereby displaying an image. The light-emitting diode D may emit light due to the current supplied through the driving thin film transistor Td from the high voltage supply VDD. For example, the amount of current flowing through the light-emitting diode D may be proportional to the magnitude of the data signal. Additionally, the intensity of light emitted by the light-emitting diode D may be proportional to the amount of current flowing through the light-emitting diode D. Thus, pixel regions SP may show different gray levels depending on the magnitude of the data signal, and as a result, the electroluminescent display device displays an image.

The storage capacitor Cst may maintain charges corresponding to the data signal for a frame when the switching thin film transistor Ts is turned off. Accordingly, even if the switching thin film transistor Ts is turned off, the storage capacitor Cst allows the amount of current flowing through the light-emitting diode D to be constant and/or the gray level shown by the light-emitting diode D to be maintained until a next frame. Finally, a transistor and/or a capacitor other than the switching and driving thin film transistors Ts and Td and/or the storage capacitor Cst may be further added in the pixel region SP.

Figure 2:
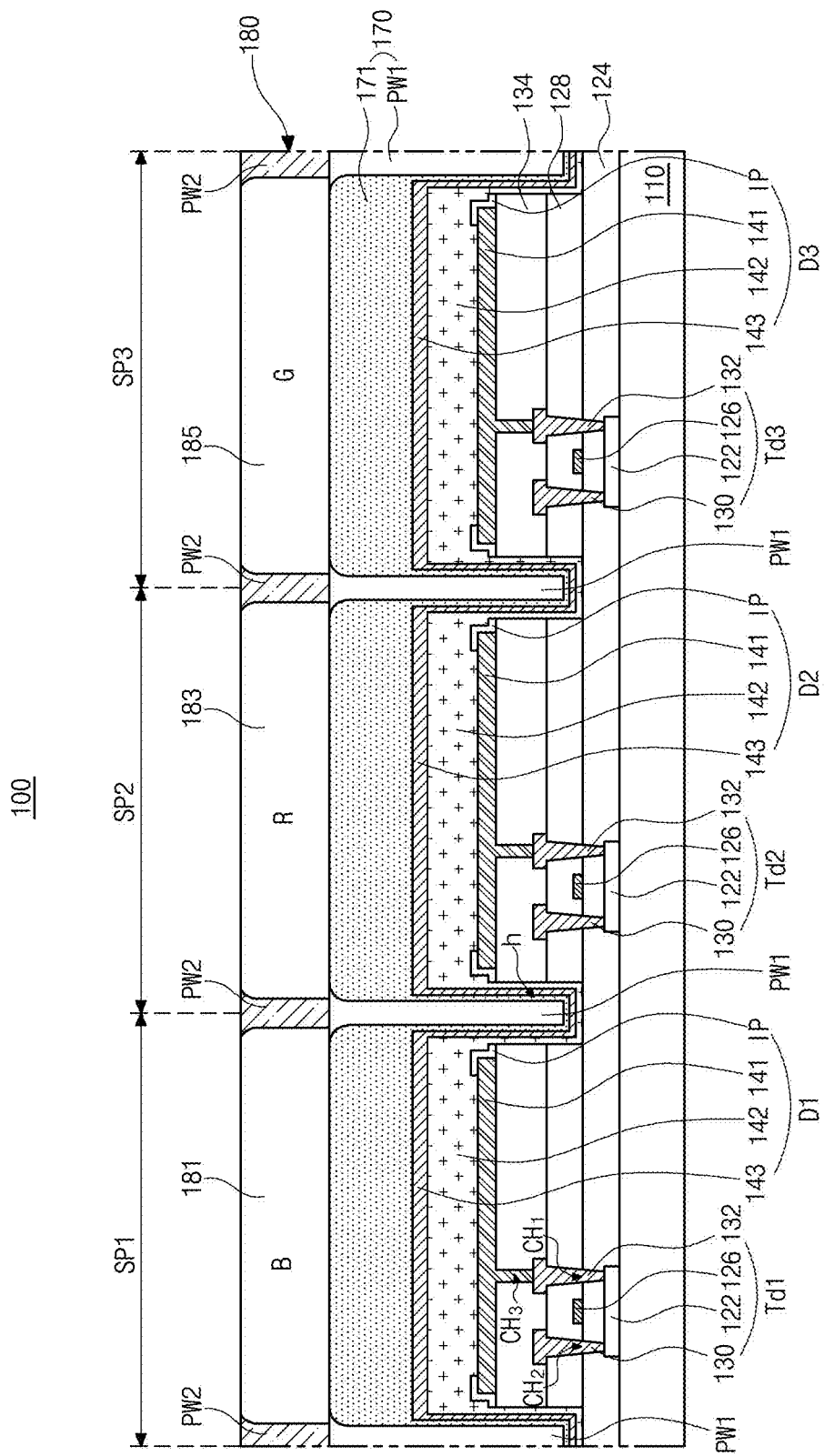
FIG. 2 is a cross-sectional view illustrating an electroluminescent display device according to a first example embodiment of the present disclosure.

FIG. 2 is a cross-sectional view illustrating an electroluminescent display device according to the first example embodiment of the present disclosure.

As illustrated in FIG. 2, an electroluminescent display device 100 may include a substrate 110, thin film transistors Td1, Td2, and Td3 and light emitting diodes D1, D2, and D3. Thin film transistors Td1, Td2, and Td3 and light emitting diodes D1, D2, and D3 may be respectively formed in pixel regions SP1, SP2, and SP3 disposed on the substrate 110. An encapsulation layer 170 may be disposed on the light emitting diodes D1, D2, and D3. A color filter layer 180 disposed on the encapsulation layer 170.

The substrate 110 may also be referred to as a lower substrate, a thin film transistor (TFT) substrate, or a backplane, in which case each of the pixel regions SP1, SP2, and SP3 may refer to a unit in which a specific type of color filter pattern among color filter patterns 181, 183, and 185 may be formed. Thus, a specific color may be emitted. For example, the pixel regions SP1, SP2, and SP3 may include a blue pixel region SP1, a red pixel region SP2, and a green pixel region SP3. However, the pixel regions SP1, SP2, and SP3 are not limited thereto, and may further include a white pixel region.

A semiconductor layer 122 may be formed in each of the pixel regions SP1, SP2, and SP3. A gate insulating layer 124 may be formed on the semiconductor layer 122 over substantially all of the substrate 110 including the pixel regions SP1, SP2, and SP3. The semiconductor layer 122 may include an active area that may be formed of one or more intrinsic semiconductor materials and disposed at the center of the semiconductor layer 122. The semiconductor layer may further include a source area and/or a drain area that are formed of one or more impurity-doped semiconductor materials and are respectively formed at left and right positions of the active area.

A gate electrode 126 may be formed on the gate insulating layer 124 corresponding to the semiconductor layer 122 and an interlayer insulating layer 128 may be formed on the gate electrode 126. The interlayer insulating layer 128 and the gate insulating layer 124 may include first and second contact holes CH1 and CH2 configured to respectively expose the source area and the drain area of the semiconductor layer 122.

A source electrode 132 and a drain electrode 130 spaced apart from each other are formed on the interlayer insulating layer 128 corresponding to the semiconductor layer 122. The source electrode 132 and the drain electrode 130 may be respectively connected to the source area and the drain area of the semiconductor layer 122 through the first and second contact holes CH1 and CH2. The semiconductor layer 122, the gate electrode 126, the source electrode 132, and the drain electrode 130 formed in each of the pixel regions SP1, SP2, and SP3 may respectively constitute each of the thin film transistors Td1, Td2, and Td3.

Although coplanar type thin film transistors Td1, Td2, and Td3 are illustrated in FIG. 2 as an example, example embodiments are not limited thereto, and staggered type thin film transistors may also be formed. Although only the driving thin film transistors Td1, Td2, and Td3 are illustrated in FIG. 2, a plurality of thin film transistors, such as the switching thin film transistor Ts of FIG. 1 having the same or substantially the same structure as the driving thin film transistors Td1, Td2, and Td3 may be formed in a single pixel region.

Although not illustrated in FIG. 2, a gate line GL, a data line DL, and/or a power line may cross each other to define the pixel regions SP1, SP2, and SP3 in FIG. 2. The switching thin film transistor Ts of FIG. 2 may be connected to the gate line GL and the data line DL. Each driving thin film transistor Td1, Td2, and Td3 may be connected to the switching thin film transistor Ts of FIG. 2 and/or the power line.

A passivation layer 134 may be formed on each of the thin film transistors Td1, Td2, and Td3. The passivation layer 134 may include a third contact hole CH3 configured to expose the source electrode 132. An overcoat layer may be disposed on the passivation layer 134. In this case, the passivation layer 134 and the overcoat layer may include the third contact hole CH3 exposing the source electrode 132.

Holes h configured to partition the pixel regions SP1, SP2, and SP3 may be formed in the passivation layer 134 and the interlayer insulating layer 128. The light emitting diodes D1, D2, and D3 may be partitioned by the holes h in the passivation layer 134 and the interlayer insulating layer 128 so that the light emitting diodes D1, D2, and D3 may respectively correspond to the pixel regions SP1, SP2, and SP3. The light emitting diodes D1, D2, and D3 may be spaced apart from each other and respectively disposed in the pixel regions SP1, SP3, and SP3.

Although the holes h are illustrated as being formed in the passivation layer 134 and the interlayer insulating layer 128 in FIG. 2, this is merely an example. The electroluminescent display device 100 may have various other structures in which holes h capable of partitioning the light emitting diodes D1, D2, and D3 corresponding to the pixel regions SP1, SP2, and SP3 are formed. Holes h may be formed by performing a light-exposing process using a photo mask and a development process.

A first electrode 141 may be disposed on the passivation layer 134. The first electrode 141 may be an anode or cathode for supplying one of holes or electrons to a light-emitting layer 142. Where the first electrode 141 of the electroluminescent display device is an anode, the first electrode 141 may be formed as a single layer of one or more transparent conductive materials, such as indium tin oxide (ITO). Alternatively, the first electrode 141 may be formed of one or more conductive materials with relatively high reflectance, such as a laminated structure of aluminum and titanium (Ti/Al/Ti), a laminated structure of Al and ITO (ITO/Al/ITO), an APC alloy, and/or a laminated structure of the APC alloy and ITO (ITO/APC/ITO) to obtain a micro cavity effect. The APC alloy refers to an alloy of silver (Ag), palladium (Pd), and copper (Cu).

The first electrode 141 may be connected to the source electrode 132 of each of the thin film transistors Td1, Td2, and Td3 through the third contact hole CH3 formed in the passivation layer 134 and may be separately formed in each of the pixel regions SP1, SP2, and SP3. Although the electroluminescent display device 100 has been described by assuming that the thin film transistors Td1, Td2, and Td3 are N-type thin film transistors and the first electrode 141 may be connected to the source electrode 132, example embodiments are not limited thereto. When the thin film transistors Td1, Td2, and Td3 are P-type thin film transistors, the first electrode 141 may be connected to the drain electrode 130.

An insulating pattern IP may be configured to cover an edge of the first electrode 141 may be disposed on the first electrode 141. The insulating pattern IP may be disposed to cover a side surface and a portion of an upper surface of the first electrode 141. The insulating pattern IP may be formed of silicon oxide, but example embodiments are not limited thereto. The insulating pattern IP may mitigate a step difference of the first electrode 141 and improve current efficiency. For example, when forming the light-emitting layer 142 on the first electrode 141, the light-emitting layer 142 may be formed to have a relatively small thickness on a stepped area of the first electrode 141 so that a current that does not contribute to emission may be substantially prevented from being focused.

The light-emitting layer 142 may be disposed on the first electrode 141 and the insulating pattern IP and the light-emitting layer 142 may emit white light. For example, the light-emitting layer 142 may have a tandem white structure in which a plurality of light-emitting layers is stacked to emit white light. The light-emitting layer 142 may include a first light-emitting layer configured to emit blue light and a second light-emitting layer disposed on the first light-emitting layer and configured to emit light having a color that turns white when mixed with blue. The second light-emitting layer may be a light-emitting layer configured to emit yellow-green light, but example embodiments are not limited thereto. A light-emitting layer 142 configured to emit one of blue light, red light, and green light may be disposed in each of the pixel regions SP1, SP2, SP3.

A luminescent material of the light-emitting layer 142 may be one or more organic luminescent materials having a refractive index of about 1.8 or higher or one or more inorganic luminescent materials, such as a quantum dot. The light-emitting layer 142 may be disposed in a shape that follows the approximate morphologies of the entire or substantially entire surfaces of the pixel regions SP1, SP2, and SP3. The light-emitting layer 142 may be disposed in a shape that follows the approximate morphology of the first electrode 141, the insulating pattern IP formed in each of the pixel regions SP1, SP2, and SP3, the holes h formed in the passivation layer 134, and the interlayer insulating layer 128.

A second electrode 143 for supplying one of electrons or holes to the light-emitting layer 142 may be disposed on the light-emitting layer 142. The second electrode 143 may be a cathode or an anode. Where the second electrode 143 of the electroluminescent display device 100 is a cathode, the second electrode 143 may be formed along the morphology of the light-emitting layer 142. In this example, the second electrode 143 may be formed to cover the light-emitting layer 142 along the shape of the light-emitting layer 142.

The second electrode 143 may be formed of one or more transparent conductive materials, such as ITO and/or indium zinc oxide (IZO) capable of transmitting light or may be formed of one or more semi-transmissive conductive materials, such as magnesium (Mg), silver (Ag), or an alloy of Mg and Ag. Accordingly, the first electrode 141, the insulating pattern IP, the light-emitting layer 142, and the second electrode 143 may overlap with each other and form each of the light emitting diodes D1, D2, and D3. The light emitting diodes D1, D2, and D3 may be spaced apart from each other and be disposed corresponding to the pixel regions SP1, SP2, and SP3, respectively.

The encapsulation layer 170 may be disposed on the light emitting diodes D1, D2, and D3 formed corresponding to the pixel regions SP1, SP2, and SP3, respectively. The encapsulation layer 170 of the electroluminescent display device 100 may include an encapsulation film 171 having a first refractive index and a first partition wall PW1 having a second refractive index lower than the first refractive index.

The encapsulation film 171 may be formed along the morphology of the light emitting diodes D1, D2, and D3 corresponding to the pixel regions SP1, SP2, and SP3, respectively. The encapsulation film 171 may be formed along the morphology of the second electrode 143 disposed at the uppermost portions of the light emitting diodes D1, D2, and D3. Because the encapsulation film 171 may be disposed along the morphology of the second electrode 143, a groove may be formed in the encapsulation film 171 corresponding to a boundary between the pixel regions SP1, SP2, and SP3. The encapsulation film 171 may be formed of an inorganic film and/or may have a multilayer structure. For example, the encapsulation film 171 may include at least one layer formed of silicon nitride, aluminum nitride, zirconium nitride, titanium nitride, hafnium nitride, tantalum nitride, silicon oxide, aluminum oxide, and/or titanium oxide.

The first partition wall PW1, which may be bar-shaped, may be disposed in the groove of the encapsulation film 171 corresponding to the boundary between the pixel regions SP1, SP2, and SP3. Although a width of an upper portion of the first partition wall PW1 is illustrated in FIGS. 2-5 as progressively increasing, this is merely an example, and the first partition wall PW1 may have the same or substantially the same width throughout. The first partition wall PW1 may be made of one or more organic materials having a second refractive index lower than a first refractive index of the encapsulation film 171. For example, the first refractive index may be in a range of about 1.56 to 1.85 and the second refractive index may be in a range of about 1.0 to 1.55, but example embodiments are not limited thereto.

Because the first partition wall PW1 may have a refractive index lower than that of the encapsulation film 171, light that may be incident obliquely on the encapsulation film 171 from the light-emitting layer 142 of the light emitting diodes D1, D2, and D3 may be reflected by the first partition wall PW1 and output to upper areas of the corresponding pixel regions SP1, SP2, and SP3. Accordingly, light extraction efficiency of the electroluminescent display device 100 may be improved and color mixture may be substantially prevented. In addition, permeation of oxygen and/or moisture into the light-emitting layer 142 and the second electrode 143 may be more substantially prevented by the encapsulation films 171 and the first partition walls PW1 disposed between the encapsulation films 171 configured to cover the light emitting diodes D1, D2, and D3.

The color filter layer 180 may be disposed on the encapsulation layer 170. The color filter layer 180 may include the color filter patterns 181, 183, and 185 formed corresponding to the pixel regions SP1, SP2, and SP3, respectively. The color filter 180 may further include a bar-shaped second partition wall PW2 disposed between the color filter patterns 181, 183, and 185. Although a width of an upper portion of the second partition wall PW2 is illustrated in FIGS. 2-5 as progressively increasing, this is merely an example, and the second partition wall PW2 may have the same or substantially the same width throughout.

The color filter patterns 181, 183, and 185 may have a third refractive index and the second partition wall PW2 may have a fourth refractive index lower than the third refractive index. For example, the third refractive index may be in a range of about 1.6 to 1.85 and the fourth refractive index may be in a range of about 1.0 to 1.55, but example embodiments are not limited thereto.

The second partition wall PW2 may be formed of silicon oxide, but example embodiments are not limited thereto. Because the second partition wall PW2 may have a refractive index lower than that of the color filter patterns 181, 183, and 185, light that may be incident obliquely on the color filter patterns 181, 183, and 185 from the light-emitting layer 142 of the light emitting diodes D1, D2, and D3 may be reflected by the second partition wall PW2 and be output to upper areas of the corresponding pixel regions SP1, SP2, and SP3. Accordingly, color mixture in a viewing angle direction may be substantially prevented.

Because the second partition wall PW2 between the color filter patterns 181, 183, and 185 has a relatively fine width, an emissive area may be increased in comparison to a related art case in which a black matrix may be disposed. The second partition wall PW2 of the electroluminescent display device may be formed corresponding to the first partition wall PW1. For example, the first partition wall PW1 and the second partition wall PW2 may be parallel or substantially parallel to each other in a first direction perpendicular to the substrate 110.

Because the first partition wall PW1 and the second partition wall PW2 may be parallel or substantially parallel to each other in the first direction, light that may be output from the light emitting diodes D1, D2, and D3 respectively formed in the pixel regions SP1, SP2, and SP3 may be output to upper areas of the corresponding pixel regions SP1, SP2, and SP3. Accordingly, light extraction efficiency may be improved and color mixture may be substantially prevented.

Figure 3:
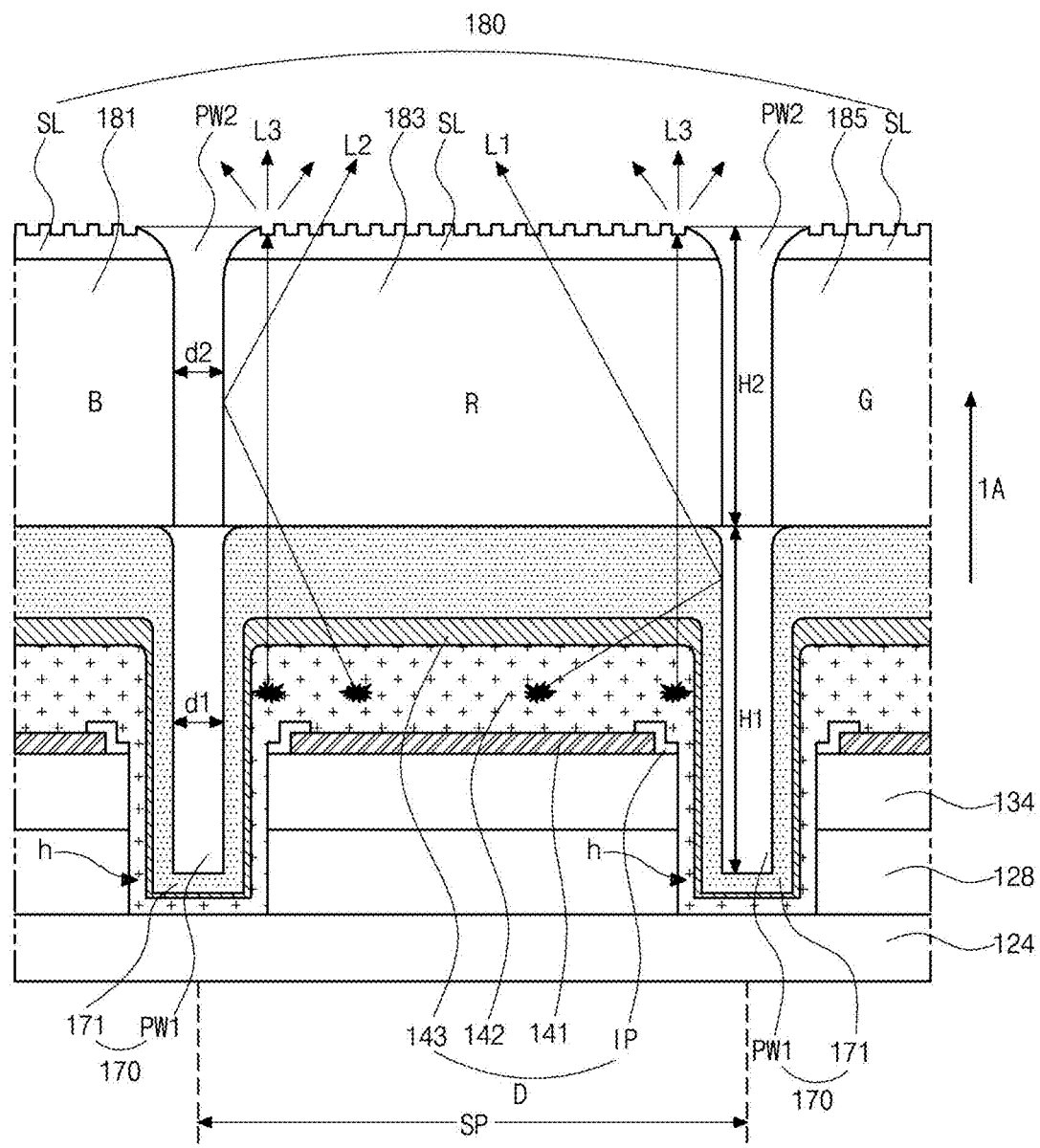
FIG. 3 is an enlarged view of a portion of an electroluminescent display device according to the first example embodiment of the present disclosure.

FIG. 3 is an enlarged view of a portion of an electroluminescent display device according to the first example embodiment of the present disclosure.

Although not illustrated in FIG. 3, the electroluminescent display device 100 of FIG. 2 may include a substrate 110 of FIG. 2. Light emitting diodes D may be disposed on the substrate 110 of FIG. 2, an encapsulation layer 170 may be disposed on the light emitting diodes D, and a color filter layer 180 may be disposed on the encapsulation layer 170. An interlayer insulating layer 128 and a passivation layer 134 may be disposed between the substrate 110 and the light emitting diodes D. Because the holes h configured to partition pixel regions SP are formed in the passivation layer 134 and the interlayer insulating layer 128, the light emitting diodes D may be formed corresponding to the pixel regions SP. Furthermore, because the holes h are formed in the passivation layer 134 and the interlayer insulating layer 128, a bank layer, which may be formed in a related art electroluminescent display device to partition pixel regions SP, may be omitted. Therefore, a process of forming the electroluminescent display device according to example embodiments of the present disclosure may be simplified.

A first electrode 141 may be disposed on the passivation layer 134 and an insulating pattern IP configured to cover an edge of the first electrode 141 may be disposed on the first electrode 141. When forming a light-emitting layer 142 on the first electrode 141 using the insulating pattern IP, the light-emitting layer 142 may be formed to have a relatively small thickness on a stepped area of the first electrode 141. Therefore, a current that does not contribute to emission may be substantially prevented from being focused, and current efficiency may be improved. The light-emitting layer 142 may be disposed on the first electrode 141 and the insulating pattern IP. The light-emitting layer 142 may be disposed in a shape that follows the morphology of the first electrode 141, the insulating pattern IP, and the holes h formed in the passivation layer 134 and the interlayer insulating layer 128. A second electrode 143 may be disposed on the light-emitting layer 142. The second electrode 143 may be disposed in a shape that follows the morphology of the light-emitting layer 142. Accordingly, the first electrode 141, the insulating pattern IP, the light-emitting layer 142, and the second electrode 143 may form the light emitting diodes D. Adjacent light emitting diodes D may be spaced apart from each other and may be disposed corresponding to the pixel regions SP.

The encapsulation layer 170, which may include an encapsulation film 171 having a first refractive index and a first partition wall PW1 having a second refractive index lower than the first refractive index, may be disposed on the light emitting diodes D. The encapsulation film 171 may be formed along the morphology of the light emitting diodes D. The encapsulation film 171 may be formed along the morphology of the second electrode 143 disposed at the uppermost portions of the light emitting diodes D.

Because the encapsulation film 171 may be disposed along the morphology of the second electrode 143, the electroluminescent display device 100 may have a structure in which the encapsulation film 171 covers each of the light emitting diodes D. Therefore, permeation of oxygen and/or moisture into the light-emitting layer 142 and the second electrode 143 may be substantially prevented. The encapsulation film 171 may be formed of an inorganic film and/or may have a multilayer structure.

The first partition wall PW1 may be disposed in the groove of the encapsulation film 171 corresponding to the boundary between the pixel regions SP. A middle portion of the first partition wall PW1 may have a bar shape and an upper portion of the first partition wall PW1 may have a shape in which a width progressively increases upward. However, this is merely an example and the first partition wall PW1 may be formed such that the upper portion and the middle portion have the same or substantially the same width. For example, a width d1 of the middle portion of the first partition wall PW1 may be in a range of about 2 micrometers (μm) to 3 μm. The width of the upper portion of the first partition wall PW1 may be larger than or equal to the width d1 of the middle portion of the first partition wall PW1. However, example embodiments are not limited thereto and the widths of the upper portion and the middle portion of the first partition wall PW1 may be modified in various ways according to, for example, the size and/or resolution of the pixel regions SP.

A height H1 of the first partition wall PW1 may be in a range of about 7 μm to 9 μm, but example embodiments are not limited thereto. The height H1 may be modified in various ways according to, for example, a thickness of the passivation layer 134, the interlayer insulating layer 128, and/or the light emitting diodes D.

The passivation layer 134 and the interlayer insulating layer 128 may be separated corresponding to the pixel regions SP by the first partition wall PW1. In this example, the first partition wall PW1 may be made of one or more organic materials having a second refractive index lower than the first refractive index of the encapsulation film 171. For example, the first refractive index may be in a range of about 1.6 to 1.85 and the second refractive index may be in a range of about 1.0 to 1.55, but example embodiments are not limited thereto.

Because the first partition wall PW1 may have a refractive index lower than that of the encapsulation film 171, light that may be incident obliquely on the encapsulation film 171 from the light-emitting layer 142 of the light emitting diodes D may be reflected by the first partition wall PW1 and may be output to upper areas of the corresponding pixel regions SP. Accordingly, light extraction efficiency of the electroluminescent display device 100 may be improved and color mixture may be substantially prevented. Because the first partition wall PW1 may be formed between the encapsulation films 171 configured to cover the light emitting diodes D, permeation of oxygen and/or moisture into the light-emitting layer 142 and the second electrode 143 may be substantially prevented. Therefore, efficiency may be improved.

The color filter layer 180 may be disposed on the encapsulation layer 170. The color filter layer 180 may include color filter patterns 181, 183, and 185 formed corresponding to the pixel regions SP and a second partition wall PW2 formed between the color filter patterns 181, 183, and 185. The color filter patterns 181, 183, and 185 may be disposed corresponding to the light emitting diodes D. Consequently, when white light is output from the light emitting diodes D, the white light may be converted into specific colored light through the color filter patterns 181, 183, and 185. Edges of the color filter patterns 181, 183, and 185 may be curved. When lights of different wavelength bands are output from the light emitting diodes D, the color filter patterns 181, 183, and 185 may be disposed corresponding to the light emitting diodes D. Therefore, the lights of different wavelength bands are substantially prevented from being mixed and causing a blurring phenomenon and/or a ghost phenomenon.

The color filter patterns 181, 183, and 185 may have a third refractive index and the second partition wall PW2 may have a fourth refractive index lower than the third refractive index. The third refractive index may be in a range of about 1.6 to 1.85 and the fourth refractive index may be in a range of about 1.0 to 1.55, but example embodiments are not limited thereto.

A middle portion of the second partition wall PW2 may have a bar shape and an upper portion of the second partition wall PW2 may have a shape in which a width progressively increases upward. A width d2 of the middle portion of the second partition wall PW2 may be in a range of 2 μm to 3 μm. The width of the upper portion of the second partition wall PW2 may be larger than or equal to the width d2. However, example embodiments are not limited thereto. A height H2 of the second partition wall PW2 may be in a range of 7 μm to 9 μm, but example embodiments are not limited thereto. The height H2 may be modified in various ways according to a thickness or the like of the color filter patterns 181, 183, and 185. The second partition wall PW2 may be formed of silicon oxide, but example embodiments are not limited thereto. The second partition wall PW2 may also be formed of an air gap.

Because the second partition wall PW2 may have a refractive index lower than that of the color filter patterns 181, 183, and 185, light that may be incident obliquely on the color filter patterns 181, 183, and 185 from the light-emitting layer 142 of the light emitting diodes D may be reflected by the second partition wall PW2 and may be output to upper areas of the corresponding pixel regions SP. Accordingly, color mixture in a viewing angle direction may be substantially prevented. Additionally, because the second partition wall PW2 between the color filter patterns 181, 183, and 185 has a relatively fine width d2, an emissive area may be increased in comparison to the related art case in which a black matrix may be disposed.

A scattering layer SL may be disposed on an upper surface of each of the color filter patterns 181, 183, and 185. The scattering layer SL may have a concavo-convex pattern formed on the upper surface of each of the color filter patterns 181, 183, and 185, but example embodiments are not limited thereto. The scattering layer SL may also be formed of a material layer including beads. Accordingly, light that passes through the color filter patterns 181, 183, and 185 and output to the outside may be scattered in various directions.

A portion of light L3 may be scattered, and may be incident vertically on the color filter patterns 181, 183, and 185 at a boundary between the pixel regions SP and toward the second partition wall PW2. Therefore, perception of lattices that may occur due to the fine second partition wall PW2 being viewed as a black area may be substantially prevented when one views an image in a state in which one's eyes are close to a screen, such as when one views an image using a virtual reality (VR) device.

The second partition wall PW2 of the electroluminescent display device 100 may be formed corresponding to the first partition wall PW1. The first partition wall PW1 and the second partition wall PW2 may parallel or substantially parallel to each other in a first direction 1A perpendicular to the substrate 110. Because the first partition wall PW1 and the second partition wall PW2 may be parallel or substantially parallel to each other in the first direction 1A, light that may be output from the light emitting diodes D respectively formed in the pixel regions SP may be output to upper areas of the corresponding pixel regions SP. Accordingly, light extraction efficiency may be improved and color mixture may be substantially prevented.

Second Example Embodiment

In a second example embodiment, descriptions of configurations identical or similar to those of the first example embodiment may be omitted.

Figure 4:
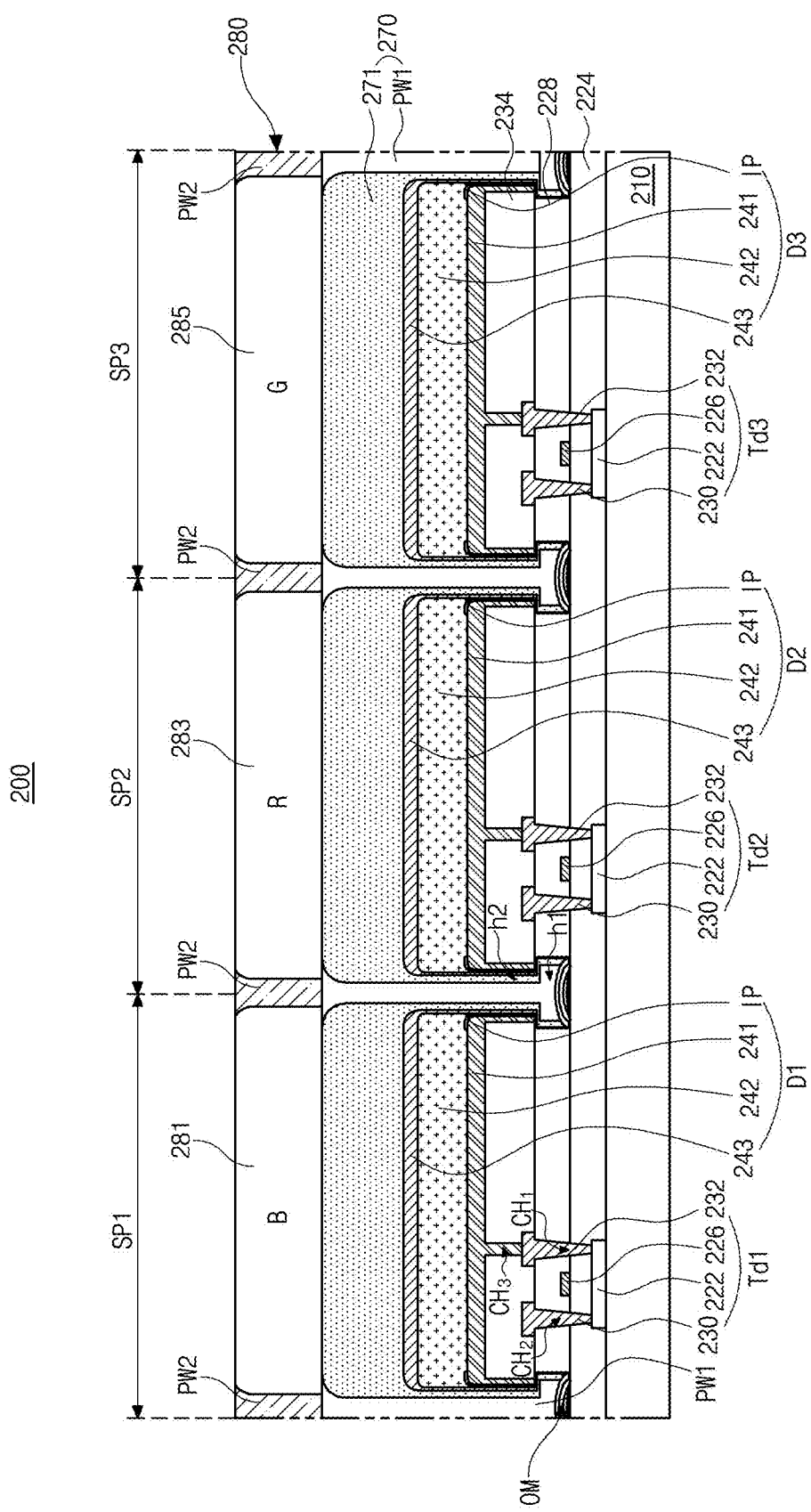
FIG. 4 is a cross-sectional view illustrating an electroluminescent display device according to a second example embodiment of the present disclosure.

FIG. 4 is a cross-sectional view illustrating an electroluminescent display device according to the second example embodiment of the present disclosure.

As illustrated in FIG. 4, an electroluminescent display device 200 according to an example embodiment of the present disclosure may include a substrate 210, thin film transistors Td1, Td2, and Td3 and light emitting diodes D1, D2, and D3 respectively formed in pixel regions SP1, SP2, and SP3 disposed on the substrate 210. The electroluminescent display device 200 may further include an encapsulation layer 270 disposed on the light emitting diodes D1, D2, and D3 and a color filter layer 280 disposed on the encapsulation layer 270.

The thin film transistors Td1, Td2, and Td3 and the light emitting diodes D1, D2, and D3 may be respectively formed in the pixel regions SP1, SP2, and SP3 on the substrate 210. The substrate 210 may also be referred to as a lower substrate, a thin film transistor (TFT) substrate, or a backplane. The pixel regions SP1, SP2, and SP3 may include a blue pixel region SP1, a red pixel region SP2, and a green pixel region SP3. However, the pixel regions SP1, SP2, and SP3 are not limited thereto and may further include a white pixel region.

A semiconductor layer 222 may be formed in each of the pixel regions SP1, SP2, and SP3. A gate insulating layer 224 may be formed on the semiconductor layer 222 over the substrate 110 including the pixel regions SP1, SP2, and SP3. A gate electrode 226 may be formed on the gate insulating layer 224 corresponding to the semiconductor layer 222 and an interlayer insulating layer 228 may be formed on the gate electrode 226. The interlayer insulating layer 228 and the gate insulating layer 224 may include first and second contact holes CH1 and CH2 configured to respectively expose the source area and the drain area of the semiconductor layer 222.

A source electrode 232 and a drain electrode 230 spaced apart from each other may be formed on the interlayer insulating layer 228 corresponding to the semiconductor layer 222. The source electrode 232 and the drain electrode 230 may be respectively connected to the source area and the drain area of the semiconductor layer 222 through the first and second contact holes CH1 and CH2. The semiconductor layer 222, the gate electrode 226, the source electrode 232, and the drain electrode 230 formed in the pixel regions SP1, SP2, and SP3 may constitute the thin film transistors Td1, Td2, and Td3.

A passivation layer 234 may be formed on each of the thin film transistors Td1, Td2, and Td3. The passivation layer 234 may include a third contact hole CH3 configured to expose the source electrode 232. In the electroluminescent display device 200, holes h1 and h2 configured to partition the pixel regions SP1, SP2, and SP3 may be formed in the interlayer insulating layer 228 and the passivation layer 234. The light emitting diodes D1, D2, and D3 may be partitioned by the holes h1 and h2 in the interlayer insulating layer 228 and the passivation layer 234 so that the light emitting diodes D1, D2, and D3 respectively correspond to the pixel regions SP1, SP2, and SP3.

The light emitting diodes D1, D2, and D3 may be spaced apart from each other and may be respectively disposed in the pixel regions SP1, SP3, and SP3. In the electroluminescent display device 200, a width of a portion of the hole h1 formed in the interlayer insulating layer 228 may be larger than a width of a portion of the hole h1 formed in the passivation layer 234. The electroluminescent display device 200 may have an under-cut form in which the width of the interlayer insulating layer 228 may be smaller than the width of the passivation layer 234 disposed in each of the pixel regions SP1, SP2, and SP3.

A first electrode 241 may be configured to cover an upper surface and a side surface of the passivation layer 234. The first electrode 241 may be connected to the source electrode 232 of each of the thin film transistors Td1, Td2, and Td3 through the third contact hole CH3 formed in the passivation layer 234 and may be separately formed in each of the pixel regions SP1, SP2, and SP3.

Because the interlayer insulating layer 228 and the passivation layer 234 of the electroluminescent display device 200 may have an under-cut form, the first electrode 241 separately formed in each of the pixel regions SP1, SP2, and SP3 may be formed by a single process. Therefore, a process of forming the electroluminescent display device according to example embodiments of the present disclosure may be simplified.

An insulating pattern IP may be configured to cover a side surface and a portion of an upper surface of the first electrode 241. The insulating pattern IP may be formed of silicon oxide, but example embodiments are not limited thereto. The insulating pattern IP may mitigate a step difference of the first electrode 241 and may improve current efficiency. For example, when forming a light-emitting layer 242 on the first electrode 241, the light-emitting layer 242 may be formed to have a relatively small thickness on a stepped area of the first electrode 241. Therefore, a current that does not contribute to emission may be substantially prevented from being focused.

The light-emitting layer 242 may be configured to cover the first electrode 241 and the insulating pattern IP. Because the interlayer insulating layer 228 and the passivation layer 234 of the electroluminescent display device 200 may have the under-cut form, the light-emitting layer 242 separately formed in each of the pixel regions SP1, SP2, and SP3 may be formed by a single process. The light-emitting layer 242 may emit white light, but example embodiments are not limited thereto. A light-emitting layer 242 configured to emit one of blue light, red light, and green light may be disposed in each of the pixel regions SP1, SP2, and SP3. A luminescent material of the light-emitting layer 242 may be made of one or more organic luminescent materials having a refractive index of about 1.8 or higher or one or more inorganic luminescent materials, such as a quantum dot.

A second electrode 243 may be configured to cover an upper surface and a side surface of the light-emitting layer 242. In some embodiments, as illustrated in FIG. 4, the second electrode 243 may be formed separately in each of the pixel regions SP1, SP2, and SP3. In other embodiments, the second electrodes 243 may be connected to each other in a cross-sectional view taken along a direction perpendicular to that of the cross-sectional view illustrated in FIG. 4. Accordingly, the first electrode 241, the insulating pattern IP, the light-emitting layer 242, and the second electrode 243 may form each of the light emitting diodes D1, D2, and D3. The light emitting diodes D1, D2, and D3 may be spaced apart from each other and may be disposed corresponding to the pixel regions SP1, SP2, and SP3, respectively.

The encapsulation layer 270 may be disposed on the light emitting diodes D1, D2, and D3 formed corresponding to the pixel regions SP1, SP2, and SP3, respectively. The encapsulation layer 270 of the electroluminescent display device 200 may include an encapsulation film 271 having a first refractive index and a first partition wall PW1 having a second refractive index lower than the first refractive index. The encapsulation film 271 may cover each of the light emitting diodes D1, D2, and D3 formed corresponding to each of the pixel regions SP1, SP2, and SP3. The encapsulation film 271 may be formed of an inorganic film and/or have a multilayer structure.

A residual layer OM may be present between the light emitting diodes D1, D2, and D3. The residual layer OM may be formed from one or more materials remaining in the hole h1 of the interlayer insulating layer 228 that may be used in forming the light emitting diodes D1, D2, and D3 and the encapsulation film 271.

The first partition wall PW1 may be disposed between the encapsulation films 271 corresponding to the boundary between the pixel regions SP1, SP2, and SP3. Although a middle portion of the first partition wall PW1 may be illustrated in FIG. 4 as having a bar shape and an upper portion of the first partition wall PW1 may be illustrated as having a shape in which a width progressively increases in the drawings, these are merely examples. The first partition wall PW1 may be formed such that the upper portion and the middle portion have the same or substantially the same width. A lower portion of the first partition wall PW1 of the electroluminescent display device 200 may be formed to have a width larger than that of the middle portion. A lower surface of the first partition wall PW1 may contact the residual layer OM.

The first partition wall PW1 may be made of one or more organic materials having a second refractive index lower than the first refractive index of the encapsulation film 271. For example, the first refractive index may be in a range of about 1.6 to 1.85 and the second refractive index may be in a range of about 1.0 to 1.55, but example embodiments are not limited thereto. Because the first partition wall PW1 may have a refractive index lower than that of the encapsulation film 271, light that may be incident obliquely on the encapsulation film 271 from the light-emitting layer 242 of the light emitting diodes D1, D2, and D3 may be reflected by the first partition wall PW1 and may be output to upper areas of the corresponding pixel regions SP1, SP2, and SP3. Accordingly, light extraction efficiency of the electroluminescent display device 200 may be improved and color mixture may be substantially prevented. In addition, permeation of oxygen and/or moisture into the light-emitting layer 242 and the second electrode 243 may be more substantially prevented by the encapsulation films 271 and the first partition wall PW1 disposed between the encapsulation films 271 configured to cover the light emitting diodes D1, D2, and D3. Because the width of the lower portion of the first partition wall PW1 may be larger than the width of the middle portion thereof and the lower surface of the first partition wall PW1 may have a structure in which the lower surface contacts the residual layer OM, efficiency may be improved. For example, substantial prevention of permeation of oxygen and/or moisture may be achieved.

The color filter layer 280 may be disposed on the encapsulation layer 270. The color filter layer 280 may include color filter patterns 281, 283, and 285 formed corresponding to the pixel regions SP1, SP2, and SP3, respectively, and second partition walls PW2 formed between the color filter patterns 281, 283, and 285. Edges of the color filter patterns 281, 283, and 285 may be curved. The color filter patterns 281, 283, and 285 may have a third refractive index and the second partition wall PW2 may have a fourth refractive index lower than the third refractive index. The third refractive index may be in a range of about 1.6 to 1.85 and the fourth refractive index may be in a range of about 1.0 to 1.55, but example embodiments are not limited thereto. The second partition wall PW2 may be formed of silicon oxide, but example embodiments are not limited thereto.

Because the second partition wall PW2 may have a refractive index lower than that of the color filter patterns 281, 283, and 285, light that may be incident obliquely on the color filter patterns 281, 283, and 285 from the light-emitting layer 242 of the light emitting diodes D1, D2, and D3 may be reflected by the second partition wall PW2 and may be output to upper areas of the corresponding pixel regions SP1, SP2, and SP3. Accordingly, color mixture in a viewing angle direction may be substantially prevented. Because the second partition wall PW2 between the color filter patterns 281, 283, and 285 may have a relatively fine width, an emissive area may be increased in comparison to a related art case in which a black matrix may be disposed.

The second partition wall PW2 of the electroluminescent display device 200 may be formed corresponding to the first partition wall PW1. For example, the first partition wall PW1 and the second partition wall PW2 may be parallel or substantially parallel to each other in a first direction perpendicular to the substrate 210. Because the first partition wall PW1 and the second partition wall PW2 may be parallel or substantially parallel to each other in the first direction, light that may be output from the light emitting diodes D1, D2, and D3 respectively formed in the pixel regions SP1, SP2, and SP3 may be output to upper areas of the corresponding pixel regions SP1, SP2, and SP3. Accordingly, light extraction efficiency may be improved and color mixture may be substantially prevented.

Figure 5:
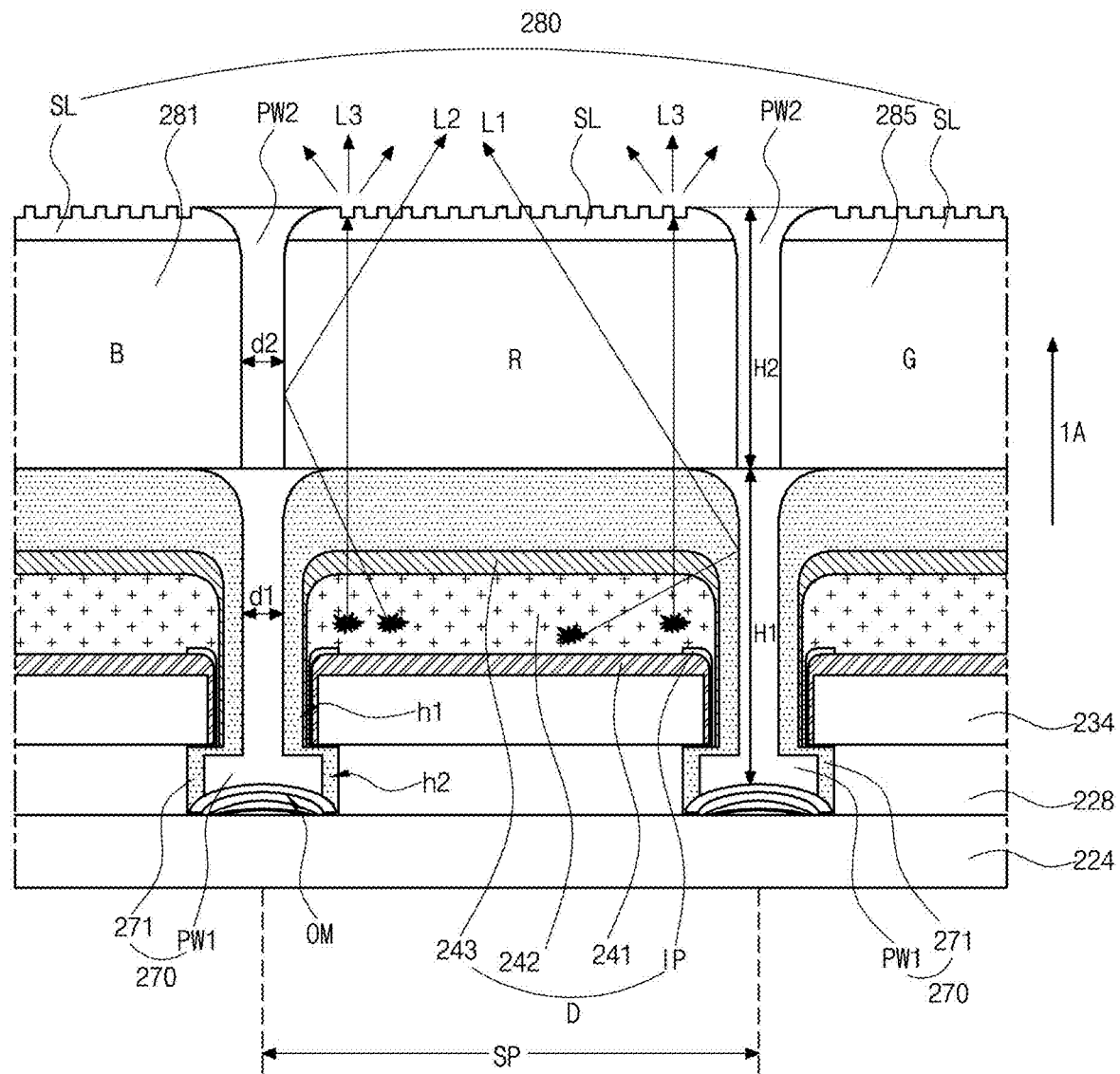
FIG. 5 is an enlarged view of a portion of the electroluminescent display device according to the second example embodiment of the present disclosure.

FIG. 5 is an enlarged view of a portion of an electroluminescent display device according to the second example embodiment of the present disclosure.

Although not illustrated in FIG. 5, the electroluminescent display device 200 of FIG. 4 may include the substrate 210 of FIG. 4. Light emitting diodes D may be disposed on the substrate 210 of FIG. 4, an encapsulation layer 270 may be disposed on the light emitting diodes D, and a color filter layer 280 may be disposed on the encapsulation layer 270. An interlayer insulating layer 228 and a passivation layer 234 may be disposed between the substrate 210 and the light emitting diodes D. Because holes h1 and h2 configured to partition pixel regions SP may be formed in the interlayer insulating layer 228 and the passivation layer 234, the light emitting diodes D may be spaced apart from each other and disposed in the pixel regions SP, respectively.

Because holes h1 and h2 may be formed in the passivation layer 234 and the interlayer insulating layer 228, a bank layer that may be formed in a related art electroluminescent display device to partition pixel regions SP may be omitted. Therefore, a process of forming the electroluminescent display device according to example embodiments of the present disclosure may be simplified.

The electroluminescent display device 200 may have an under-cut form in which the width of the interlayer insulating layer 228 may be smaller than the width of the passivation layer 234 disposed in each of the pixel regions SP. A first electrode 241 may be configured to cover an upper surface and a side surface of the passivation layer 234. Because the interlayer insulating layer 228 and the passivation layer 234 may have the under-cut form, the first electrode 241 separately formed in each of the pixel regions SP may be formed by a single process. Therefore, a process of forming the electroluminescent display device according to example embodiments of the present disclosure may be simplified.

An insulating pattern IP may be configured to cover a side surface and a portion of an upper surface of the first electrode 241. When forming a light-emitting layer 242 on the first electrode 241 using such an insulating pattern IP, the light-emitting layer 242 may be formed to have a relatively small thickness on a stepped area of the first electrode 241. Therefore, a current that does not contribute to emission may be substantially prevented from being focused, thus improving current efficiency. The light-emitting layer 242 may be configured to cover the first electrode 241 and the insulating pattern IP. Because the interlayer insulating layer 228 and the passivation layer 234 of the electroluminescent display device 200 may have the under-cut form, the light-emitting layer 242 separately formed in each of the pixel regions SP may be formed by a single process. The second electrode 243 may be configured to cover an upper surface and a side surface of the light-emitting layer 242. The first electrode 241, the insulating pattern IP, the light-emitting layer 242, and the second electrode 243 may form each of the light emitting diodes D and the light emitting diodes D may be separated from each other and disposed corresponding to the pixel regions SP, respectively.

The encapsulation layer 270 may be disposed on the light emitting diodes D formed corresponding to the pixel regions SP, respectively. The encapsulation layer 270 may include an encapsulation film 271 having a first refractive index and a first partition wall PW1 having a second refractive index lower than the first refractive index. The encapsulation film 271 may cover each of the light emitting diodes D formed corresponding to each of the pixel regions SP. The encapsulation film 271 may be formed of an inorganic film and/or have a multilayer structure. Because the encapsulation film 271 may cover each of the light emitting diodes D, permeation of oxygen and/or moisture into the light-emitting layer 242 and/or the second electrode 243 may be substantially prevented.

A residual layer OM may be present between the light emitting diodes D. The residual layer OM may be formed from one or more materials that may be used in forming the light emitting diodes D and the encapsulation film 271 remaining in the hole h1 of the interlayer insulating layer 228.

The first partition wall PW1 may be disposed between the encapsulation films 271 corresponding to the boundary between the pixel regions SP. Although a middle portion of the first partition wall PW1 may be illustrated in FIG. 5 as having a bar shape and an upper portion of the first partition wall PW1 may be illustrated as having a shape in which a width progressively increases, this is merely an example. The first partition wall PW1 may be formed such that the upper portion and the middle portion have the same or substantially the same width. A lower portion of the first partition wall PW1 of the electroluminescent display device 200 may be formed to have a width larger than that of the middle portion and a lower surface of the first partition wall PW1 may contact the residual layer OM. A width d1 of the middle portion of the first partition wall PW1 may be in a range of about 2 μm to 3 μm. The width of the upper portion of the first partition wall PW1 may be greater than or equal to the width d1 of the middle portion of the first partition wall PW1. However, example embodiments are not limited thereto and the size and form of the first partition wall PW1 may be modified in various ways according to, for example, the size and/or resolution of the pixel regions SP. A height H1 of the first partition wall PW1 may be in a range of about 7 μm to 9 μm, but example embodiments are not limited thereto. The height H1 may be modified in various ways according to, for example, a thickness of the passivation layer 234, the interlayer insulating layer 228, and/or the light emitting diodes D.

The first partition wall PW1 may be made of one or more organic materials having a second refractive index lower than the first refractive index of the encapsulation film 271. For example, the first refractive index may be in a range of about 1.6 to 1.85 and the second refractive index may be in a range of about 1.0 to 1.55, but example embodiments are not limited thereto. Because the first partition wall PW1 may have a refractive index lower than that of the encapsulation film 271, light that may be incident obliquely on the encapsulation film 271 from the light-emitting layer 242 of the light emitting diodes D may be reflected by the first partition wall PW1 and may be output upward. Accordingly, light extraction efficiency of the electroluminescent display device 200 may be improved and color mixture may be substantially prevented. Additionally, by forming the first partition wall PW1 between the encapsulation films 271 configured to respectively cover the light emitting diodes D, efficiency of substantially preventing infiltration of oxygen and/or moisture into the light-emitting layer 242 and/or the second electrode 243 may be improved. Finally, because the width of the lower portion of the first partition wall PW1 may be greater than the width of the middle portion thereof and the lower surface of the first partition wall PW1 may have a structure in which the lower surface contacts the residual layer OM, stability of the light emitting diodes D may be further improved.

The color filter layer 280 may be disposed on the encapsulation layer 270. The color filter layer 280 may include color filter patterns 281, 283, and 285 formed corresponding to the pixel regions SP, respectively, and a second partition wall PW2 formed between the color filter patterns 281, 283, and 285. The color filter patterns 281, 283, and 285 may have a third refractive index and the second partition wall PW2 may have a fourth refractive index lower than the third refractive index. The third refractive index may be in a range of about 1.6 to 1.85 and the fourth refractive index may be in a range of about 1.0 to 1.55, but example embodiments are not limited thereto.

A width d2 of a middle portion of the second partition wall PW2 may be in a range of 2 μm to 3 μm. A width of an upper portion of the second partition wall PW2 may be larger than or equal to the width d2 of the middle portion of the second partition wall PW2. However, example embodiments are not limited thereto. A height H2 of the second partition wall PW2 may be in a range of about 7 μm to 9 μm, but example embodiments are not limited thereto. The height H2 may be modified in various ways according to, for example, a thickness of the color filter patterns 281, 283, and 285. The second partition wall PW2 may be formed of silicon oxide, but example embodiments are not limited thereto. The second partition wall PW2 may also be formed of an air gap.

Because the second partition wall PW2 may have a refractive index lower than that of the color filter patterns 281, 283, and 285, light L2 that may be incident obliquely on the color filter patterns 281, 283, and 285 from the light-emitting layer 242 of the light emitting diodes D may be reflected by the second partition wall PW2 and may be output upward. Accordingly, color mixture occurs in a viewing angle direction may be substantially prevented. Because the second partition wall PW2 between the color filter patterns 281, 283, and 285 may have a relatively fine width d2, an emissive area may be increased in comparison to the related art case in which a black matrix may be disposed.

A scattering layer SL may be disposed on an upper surface of each of the color filter patterns 281, 283, and 285. The scattering layer SL may have a concavo-convex pattern formed on the upper surface of each of the color filter patterns 281, 283, and 285, but example embodiments are not limited thereto. The scattering layer SL may also be formed of one or more material layers including beads. Accordingly, light that passes through the color filter patterns 281, 283, and 285 and output to the outside may be scattered in various directions. By scattering a portion of light L3 that may be incident vertically on the color filter patterns 281, 283, and 285 at a boundary between the pixel regions SP toward the second partition wall PW2, perception of lattices may occur due to the fine second partition wall PW2 being viewed as a black area. Such perception of lattices may be substantially prevented when one views an image in a state in which one's eyes are close to a screen, such as when one views an image using a VR device.

The second partition wall PW2 of the electroluminescent display device 200 of FIG. 5 may be formed corresponding to the first partition wall PW1. The first partition wall PW1 and the second partition wall PW2 may be parallel to each other in a first direction 1A perpendicular to the substrate 110 of FIG. 4. Because the first partition wall PW1 and the second partition wall PW2 may be parallel to each other in the first direction 1A, light that may be output from the light emitting diodes D respectively formed in the pixel regions SP may be output to upper areas of the corresponding pixel regions SP. Accordingly, light extraction efficiency may be improved and color mixture may be substantially prevented.

Figure 6:
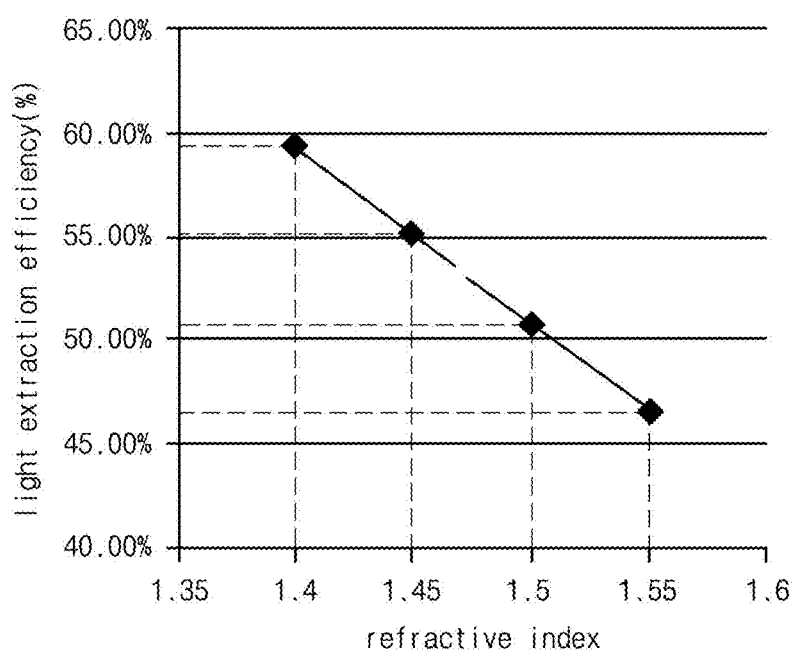
FIG. 6 is a graph illustrating light extraction efficiency according to refractive indices of first and second partition walls according to the first and second example embodiments of the present disclosure.

FIG. 6 is a graph illustrating light extraction efficiency according to refractive indices of first and second partition walls according to the first and second example embodiments of the present disclosure.

As illustrated in FIG. 6, light extraction efficiency may change according to changes in refractive indices of first and second partition walls PW1 and PW2 of FIG. 5 when refractive indices of an encapsulation film 271 of FIG. 5 and color filter patterns 281, 283, and 285 of FIG. 5 are about 1.7. Light extraction efficiency may increase as the refractive indices of the first and/or second partition walls PW1 and PW2 of FIG. 5 decrease from about 1.55 to about 1.4.

Light extraction efficiency may be about 47% when the refractive indices of the first and/or second partition walls PW1 and PW2 of FIG. 5 are about 1.55. Light extraction efficiency may be about 51% when the refractive indices of the first and/or second partition walls PW1 and PW2 of FIG. 5 are about 1.5. Light extraction efficiency may be about 55.5% when the refractive indices of the first and/or second partition walls PW1 and PW2 of FIG. 5 are about 1.45. Light extraction efficiency may be about 59% when the refractive indices of the first and/or second partition walls PW1 and PW2 of FIG. 5 are about 1.4. Accordingly, light extraction efficiency may be greatest when the refractive indices of the first and/or second partition walls PW1 and PW2 of FIG. 5 are about 1.4. For example, a path of light that may be obliquely output outward from light emitting diodes D may be adjusted through the first and/or second partition walls PW1 and PW2 of FIG. 5. The largest amount of light may be output to the outside when the refractive indices of the first and second partition walls PW1 and PW2 of FIG. 5 are about 1.4. Accordingly, light extraction efficiency may be improved by setting the refractive indices of the first and/or second partition walls PW1 and PW2 of FIG. 5 of the electroluminescent display device 100 of FIG. 2 and the electroluminescent display device 200 of FIG. 4 according to embodiments of the present disclosure to be about 1.4.

In the present disclosure, a first partition wall having a low refractive index may be disposed between light emitting diodes. Accordingly, a path of light that may not be output to the outside because it may be totally reflected inside the light emitting diodes may be changed and the light may be allowed to be output to the outside. Accordingly, light extraction efficiency may be improved. A second partition wall having a low refractive index may be disposed between color filter patterns. Accordingly, a path of light that may travel to an adjacent pixel region may be changed and the light may be allowed to be output to a corresponding pixel region, thus substantially preventing color mixture.

It will be apparent to those skilled in the art that various modifications and variations may be made in the electroluminescent display device of the present disclosure without departing from the technical idea or scope of the disclosure. Thus, it is intended that the present disclosure cover the modifications and variations of this disclosure, provided that they come within the scope of the appended claims and their equivalents.

What is claimed is:

1. An electroluminescent display device comprising:
    a substrate including a plurality of pixel regions;
    a plurality of light emitting diodes spaced apart from each other on the substrate and each corresponding to the plurality of pixel regions, respectively;
    a plurality of encapsulation films respectively covering each of the light emitting diodes of the plurality of light emitting diodes, wherein the plurality of encapsulation films has a first refractive index;
    a first partition wall disposed between each of the encapsulation films of the plurality of encapsulation films, wherein the first partition wall corresponds to a boundary between the plurality of pixel regions and has a second refractive index lower than the first refractive index; and
    a color filter layer disposed on the plurality of encapsulation films and the first partition wall,
    wherein the color filter layer includes a plurality of color filter patterns having a third refractive index and the color filter layer further includes a second partition wall disposed between each of the plurality of color filter patterns, and
    wherein the second partition wall has a fourth refractive index lower than the third refractive index.

2. The electroluminescent display device of claim 1, wherein the second partition wall is disposed corresponding to the first partition wall.

3. The electroluminescent display device of claim 2, wherein the second partition wall is parallel to the first partition wall in a direction perpendicular to the substrate.

4. The electroluminescent display device of claim 1, wherein each of the plurality of color filter patterns is disposed to correspond to each of the plurality of light emitting diodes, respectively.

5. The electroluminescent display device of claim 1, wherein a middle portion of each of the first partition wall and the second partition wall has a bar shape and an upper portion of each of the first partition wall and the second partition wall has a width that progressively increases in an upward direction.

6. The electroluminescent display device of claim 5, wherein a width of the middle portion of each of the first partition wall and the second partition wall is in a range of 2 micrometers to 3 micrometers, inclusive.

7. The electroluminescent display device of claim 5, wherein a height of each of the first partition wall and the second partition wall is in a range of 7 micrometers to 9 micrometers, inclusive.

8. The electroluminescent display device of claim 1, wherein each of the second refractive index and the fourth refractive index is in a range of 1.0 to 1.55, inclusive.

9. The electroluminescent display device of claim 1, wherein the color filter layer further includes a scattering layer disposed on an upper surface of each of the plurality of color filter patterns.

10. The electroluminescent display device of claim 9, wherein the scattering layer has a concavo-convex pattern.

11. The electroluminescent display device of claim 9, wherein the scattering layer is formed of one or more materials including beads.

12. The electroluminescent display device of claim 1, wherein an edge of each of the plurality of color filter patterns is curved.

13. The electroluminescent display device of claim 1, wherein each of the plurality of light emitting diodes includes:

a first electrode disposed on a passivation layer;

an insulating pattern configured to cover an edge of the first electrode;

a light-emitting layer disposed on the first electrode and the insulating pattern; and a second electrode disposed on the light-emitting layer.

14. The electroluminescent display device of claim 13, further including an interlayer insulating layer disposed under the passivation layer, wherein the passivation layer and the interlayer insulating layer are separated in each pixel region by the first partition wall.

15. The electroluminescent display device of claim 13, wherein a width of a first portion of the light-emitting layer on the first electrode is greater than a width of a second portion of the light-emitting layer on the insulating pattern.

* * * * *